United States Patent
Hiraoka et al.

(10) Patent No.: US 9,711,761 B2
(45) Date of Patent: Jul. 18, 2017

(54) ELECTRO LUMINESCENCE PANEL AND METHOD FOR MANUFACTURING ELECTRO LUMINESCENCE PANEL

(75) Inventors: Tomomi Hiraoka, Hyogo (JP); Yasuo Segawa, Hyogo (JP)

(73) Assignee: JOLED INC., Tokyo (JP)

( * ) Notice: Subject to any disclaimer, the term of this patent is extended or adjusted under 35 U.S.C. 154(b) by 147 days.

(21) Appl. No.: 14/343,871

(22) PCT Filed: Sep. 15, 2011

(86) PCT No.: PCT/JP2011/005207
§ 371 (c)(1),
(2), (4) Date: Mar. 10, 2014

(87) PCT Pub. No.: WO2013/038450
PCT Pub. Date: Mar. 21, 2013

(65) Prior Publication Data
US 2014/0209891 A1 Jul. 31, 2014

(51) Int. Cl.
*H01L 51/56* (2006.01)
*H01L 51/52* (2006.01)
*H01L 27/32* (2006.01)

(52) U.S. Cl.
CPC .......... *H01L 51/56* (2013.01); *H01L 27/3241* (2013.01); *H01L 27/3244* (2013.01);
(Continued)

(58) Field of Classification Search
CPC . H01L 51/56; H01L 51/5221; H01L 27/3244; H01L 27/3241; H01L 2251/5392; H01L 51/5228; H01L 2251/568
(Continued)

(56) References Cited

U.S. PATENT DOCUMENTS

| 7,234,984 B2 | 6/2007 | Nishikawa et al. |
| 7,258,586 B2 | 8/2007 | Tamura et al. |

(Continued)

FOREIGN PATENT DOCUMENTS

| JP | 2004-227852 | 8/2004 |
| JP | 2005-276600 | 10/2005 |

(Continued)

OTHER PUBLICATIONS

U.S. Appl. No. 14/343,871 to Tomomi Hiraoka et al., filed Mar. 10, 2014.

(Continued)

*Primary Examiner* — William F Kraig
*Assistant Examiner* — Pavel Ivanov
(74) *Attorney, Agent, or Firm* — Greenblum & Bernstein, P.L.C.

(57) ABSTRACT

The present invention provides an organic EL panel and a manufacturing method of the organic EL layer which can slow the reduction in the light emission lifetime of an organic layer and allow a short-circuit defect to be repaired. Organic EL elements include: an organic EL element including a short-circuit portion, and an altered portion formed to be highly resistive by irradiating a cathode with a laser beam; and an organic EL element which does not include the short-circuit portion. In the organic EL element, an organic EL layer emits light when a voltage higher than or equal to a first voltage is applied. In the organic EL element, the organic EL layer emits light when a voltage higher than equal to a second voltage that is higher than the first voltage is applied.

7 Claims, 10 Drawing Sheets (52) U.S. Cl.
CPC ...... *H01L 51/5221* (2013.01); *H01L 51/5228* (2013.01); *H01L 2251/5392* (2013.01); *H01L 2251/568* (2013.01)

(58) Field of Classification Search
USPC ................................................ 438/4; 257/40
See application file for complete search history.

(56) References Cited

U.S. PATENT DOCUMENTS

| | | | |
|---|---|---|---|
| 7,611,745 B2 | 11/2009 | Nishikawa et al. | |
| 8,283,661 B2 | 10/2012 | Miyazawa et al. | |
| 2003/0001494 A1* | 1/2003 | Wakimoto | H01L 51/0575 313/505 |
| 2003/0222861 A1 | 12/2003 | Nishikawa et al. | |
| 2004/0202777 A1 | 10/2004 | Nishikawa et al. | |
| 2005/0215163 A1 | 9/2005 | Tamura et al. | |
| 2008/0272989 A1* | 11/2008 | Takahashi | G09G 3/3216 345/76 |
| 2009/0021455 A1* | 1/2009 | Miller | G09G 3/3216 345/77 |
| 2011/0104842 A1* | 5/2011 | Miyazawa | H01L 27/3244 438/34 |
| 2011/0227104 A1 | 9/2011 | Miyazawa et al. | |
| 2014/0008628 A1 | 1/2014 | Yamana et al. | |

FOREIGN PATENT DOCUMENTS

| | | |
|---|---|---|
| JP | 2006-323032 | 11/2006 |
| JP | 2007-042498 | 2/2007 |
| JP | 2011-090889 | 5/2011 |
| JP | 2011-134490 | 7/2011 |
| WO | 2010/122782 | 10/2010 |

OTHER PUBLICATIONS

International Search Report (ISR) in International Patent Application No. PCT/JP2011/005207, dated Oct. 11, 2011.

* cited by examiner

ELECTRO LUMINESCENCE PANEL AND METHOD FOR MANUFACTURING ELECTRO LUMINESCENCE PANEL

TECHNICAL FIELD

The present invention relates to an organic electroluminescence (hereinafter referred to as "organic EL") panel including EL elements, and a method for manufacturing the organic EL panel. In particular, the present invention relates to a technique to repair a short-circuit defect in the organic EL panel.

BACKGROUND ART

A conventional organic EL element includes an organic EL layer formed between an upper electrode working as a cathode and a lower electrode working as an anode. The organic EL element becomes defective due to a short circuit of the upper electrode and the lower electrode which occurs when, for example, a conductive foreign substance attaches to or enters the element during its manufacturing process. When the defective and abnormal element is included in a pixel, the pixel becomes defective and appears to be a dead spot or a dark spot.

Here, several known techniques are used to repair such a defective pixel by irradiating an abnormal element with a laser beam (see Patent Literatures, or PTLs 1 to 3, for example).

An exemplary repairing technique disclosed in PTL 3 involves detecting a conductive foreign substance attached to an abnormal element, and irradiating a region around the foreign substance with the laser beam. The technique can repair a short-circuit defect of the upper electrode and the lower electrode, without directly irradiating the foreign substance with the laser beam.

CITATION LIST

Patent Literature

[PTL 1]
Japanese Unexamined Patent Application Publication No. 2007-42498
[PTL 2]
Japanese Unexamined Patent Application Publication No. 2006-323032
[PTL 3]
Japanese Unexamined Patent Application Publication No. 2005-276600

SUMMARY OF INVENTION

Technical Problem

The repairing techniques disclosed in PTLs 1 to 3, however, prevent an electric current from flowing through a laser-irradiated spot in the repaired abnormal element. The prevention of the current flow causes a rise in the current density, as much as the prevented current, of a spot which is included in the repaired abnormal element and left un-irradiated with the laser beam (glowing spot). As a result, the element suffers quick deterioration in luminance. In the repair, when an organic EL layer is irradiated with a high-energy laser beam, the irradiated organic EL layer is thermally deteriorated. Consequently, the repairing techniques in PTLs 1 to 3 cause a problem of reducing the light emission lifetime of the organic EL layer.

The present invention is conceived in view of the above problems and aims to provide an organic EL panel and a manufacturing method of the organic EL layer which can slow the reduction in the light emission lifetime of an organic layer and allow a short-circuit defect to be repaired.

Solution to Problem

In order to achieve the above aim, an organic EL panel according to the present invention includes organic EL elements arranged in a matrix and each including an anode, a cathode, and an organic EL layer provided between the anode and the cathode. The organic EL elements include: an abnormal element including: a short-circuit portion at which the anode and the cathode short-circuit; and a resistive portion which is (i) formed to be highly resistive by irradiating at least one of the anode, the organic EL layer, and the cathode with a laser beam, and (ii) positioned on a current pathway between the short-circuit portion and one of the anode and the cathode; and a normal element which does not include the short-circuit portion, in the normal element, the organic EL layer (i) emits light when a voltage higher than or equal to a first voltage is applied between the anode and the cathode, and (ii) does not emit light when a voltage lower than the first voltage is applied between the anode and the cathode, and in the abnormal element, the organic EL layer (i) emits light when a voltage higher than or equal to a second voltage is applied between the anode and the cathode, and (ii) does not emit light when a voltage lower than the second voltage is applied between the anode and the cathode, the second voltage being higher than the first voltage.

Advantageous Effects of Invention

An organic EL panel and a manufacturing method thereof according to the present invention can slow the reduction in the light emission lifetime of the organic EL layer and allow a short-circuit defect to be repaired.

BRIEF DESCRIPTION OF DRAWINGS

FIGS. 4 (a) and (b) illustrates configurations of two pixels included in the organic EL panel according to the embodiment of the present invention.

FIG. 8 (a)-(c) illustrates a cross-sectional view representing the method for manufacturing the organic EL panel according to the embodiment of the present invention.

FIGS. 9 (a) and (b) illustrates configurations of two pixels included in a modification of the organic EL panel according to the embodiment of the present invention.

DESCRIPTION OF EMBODIMENT

An organic EL panel according to an implementation of the present invention includes organic EL elements arranged in a matrix and each including an anode, a cathode, and an organic EL layer provided between the anode and the cathode. The organic EL elements include: an abnormal element including: a short-circuit portion at which the anode and the cathode short-circuit; and a resistive portion which is (i) formed to be highly resistive by irradiating at least one of the anode, the organic EL layer, and the cathode with a laser beam, and (ii) positioned on a current pathway between the short-circuit portion and one of the anode and the cathode; and a normal element which does not include the short-circuit portion, in the normal element, the organic EL layer (i) emits light when a voltage higher than or equal to a first voltage is applied between the anode and the cathode, and (ii) does not emit light when a voltage lower than the first voltage is applied between the anode and the cathode, and in the abnormal element, the organic EL layer (i) emits light when a voltage higher than or equal to a second voltage is applied between the anode and the cathode, and (ii) does not emit light when a voltage lower than the second voltage is applied between the anode and the cathode, the second voltage being higher than the first voltage.

According to the aspect, the resistive portion is formed on a current pathway between an electrode and the short-circuit portion. Such a feature makes it possible to cause the abnormal element to normally emit light by flowing a current to the organic EL layer, and to repair a short-circuit defect. Moreover, the short-circuit portion is not completely insulated and allows a portion of the current to flow in the short-circuit portion. Such features contribute to curbing a rise in the current density of the organic EL layer and slowing the reduction in the light emission lifetime of the abnormal element.

Here, the resistive portion may have: a resistance lower than a resistance of the organic EL layer when a voltage lower than a third voltage is applied between the anode and the cathode; and a resistance higher than the resistance of the organic EL layer when a voltage higher than or equal to the third voltage is applied between the anode and the cathode.

According to the aspect, the resistance of the resistive portion found on the current pathway is higher than the resistance of the organic EL layer when a voltage between the electrodes (a voltage for which a normal element emits light whose luminance is of a low gradation close to black) is higher than or equal to the third voltage. Hence, when the voltage is higher than or equal to the third voltage, the above features make it possible to flow more currents to the organic EL layer than to the resistive portion, and cause the abnormal element to emit light. Hence, when the voltage is higher or equal to the third voltage, the features allow the abnormal element to have the same light-emitting characteristics as the light-emitting characteristics obtained when the abnormal element is repaired to completely insulate the short-circuit portion, even though the resistive portion does not have to be repaired to be completely insulated. In addition, since the organic EL layer does not have to be newly repaired to be highly resistive, there is no increase in current density or thermal deterioration caused by a decrease in light-emitting area due to repair. Here, the abnormal element does not normally emit light since a current flows from the organic EL layer to the short-circuit portion when the voltage is lower than the third voltage. The normal element, however, emits light whose luminance is of a low gradation close to black, which does no cause any problem in visual sense.

The resistive portion may be at least one of the anode, the organic EL layer, and the cathode which is irradiated with the laser beam and denatured into a highly resistive substance.

The resistive portion may have an ohmic property.

The third voltage may be lower than or equal to a voltage corresponding to a current value of 50% of a maximum value of a current which flows in the organic EL layer in the normal element.

The resistive portion may be formed to be highly resistive by irradiating, with the laser beam, at least one of the anode and the cathode, the laser beam surrounding or contacting the short-circuit portion.

A method for manufacturing an organic EL panel includes: forming organic EL elements each including an anode, an organic EL layer, and a cathode; and repairing an abnormal element in the organic EL elements, the organic EL elements including the abnormal element and a normal element, wherein the abnormal element includes a short-circuit portion at which the anode and the cathode short-circuit, the normal element does not include the short-circuit portion, the repairing the abnormal element includes forming a resistive portion which is (i) formed to be highly resistive by irradiating with a laser beam at least one of the anode, the organic EL layer, and the cathode included in the abnormal element, and (ii) positioned on a current pathway between the short-circuit portion and one of the anode and the cathode, in the normal element, the organic EL layer (i) emits light when a voltage higher than or equal to a first voltage is applied between the anode and the cathode, and (ii) does not emit light when a voltage lower than the first voltage is applied between the anode and the cathode, and in the abnormal element, the organic EL layer (i) emits light when a voltage higher than or equal to a second voltage is applied between the anode and the cathode, and (ii) does not emit light when a voltage lower than the second voltage is applied between the anode and the cathode, the second voltage being higher than the first voltage.

According to the aspect, the features can slow the reduction in the light emission lifetime of an organic EL layer in an abnormal element and allow a short-circuit defect to be repaired.

Described hereinafter are an organic EL panel and a method for manufacturing the organic EL panel according to an embodiment of the present invention, with reference to the drawings. It is noted that the embodiment below is a specific example of the present invention. The numerical values, shapes, materials, constituent elements, arrangement positions of and connecting schemes between the constituent elements, steps, and an order of steps all described in the embodiment are examples, and shall not be defined as they are. The present invention shall be defined only by claims. Hence, among the constituent elements in the embodiment, those not described in an independent claim representing the most generic concept of the present invention are not necessarily required to achieve the objects of the present invention; however, such constituent elements are introduced to implement a preferable form of the present invention.

Figure 1:
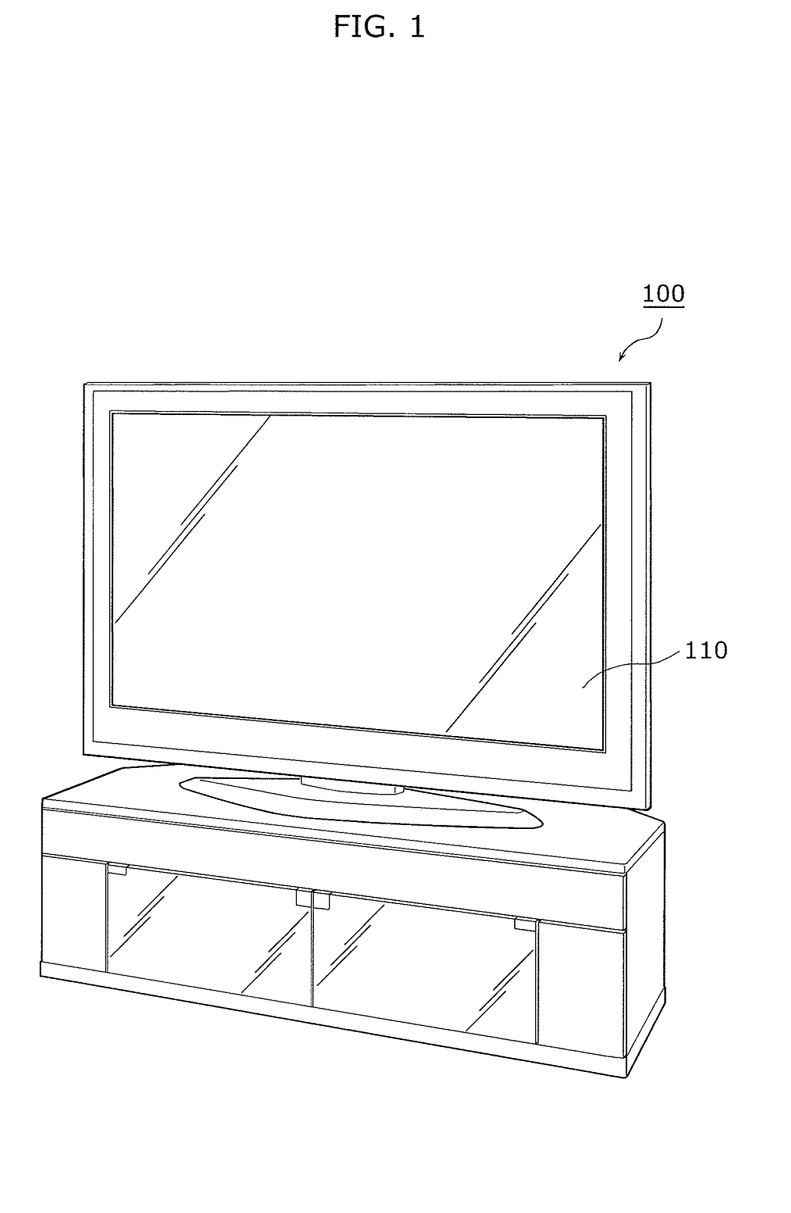
FIG. 1 illustrates an overall view of a display apparatus according to an embodiment of the present invention.
Figure 2:
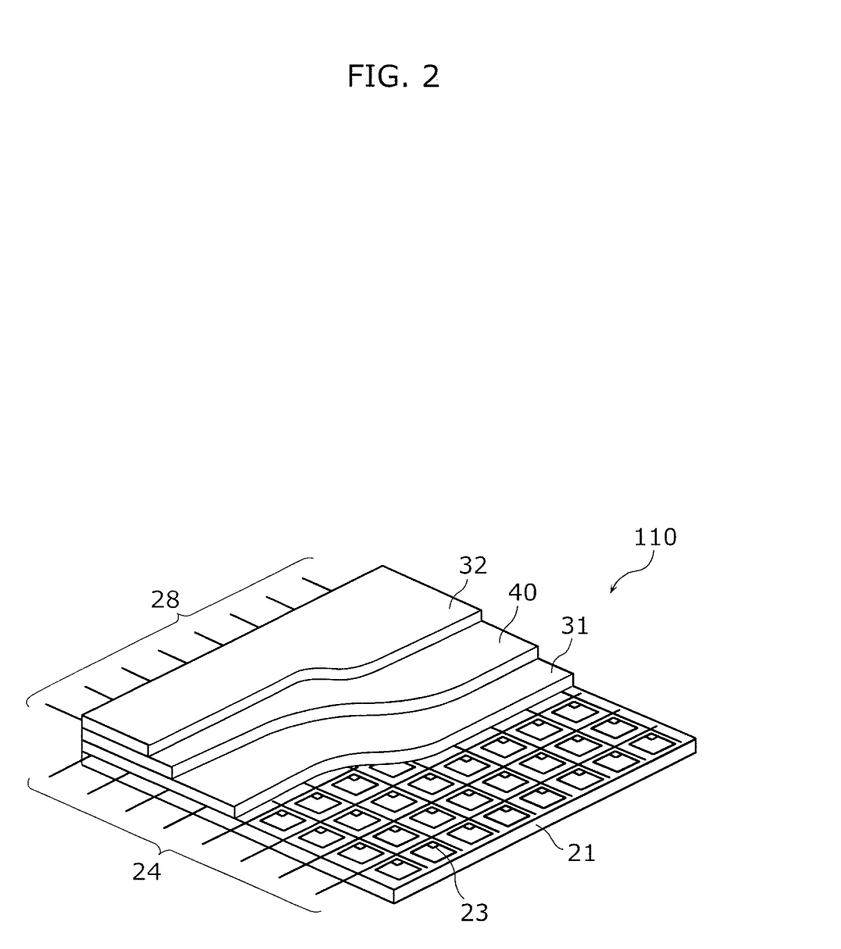
FIG. 2 illustrates a cur-out perspective view of an organic EL panel according to the embodiment of the present invention.

FIG. 1 illustrates an overall view of a display apparatus according to an embodiment of the present invention. FIG. 2 illustrates a cur-out perspective view of an organic EL panel according to the embodiment of the present invention.

A display apparatus 100 in FIG. 1 includes an organic EL panel 110 in FIG. 2. The organic EL panel 110 includes: an active-matrix substrate 21; multiple pixel circuits (driving circuits) 23 which are arranged in a matrix on the active-matrix substrate 21 and are different from one another; an anode 31, an organic EL layer 40, and a cathode (a transparent electrode) 32 which are sequentially stacked above the pixel circuits; and multiple source lines 24 and gate lines 28 connecting each of the pixel circuits 23 to a control circuit (not shown). The organic EL layer 40 is separated by banks into the pixels circuits 23—multiple regions each corresponding to one of the pixels.

Figure 3:
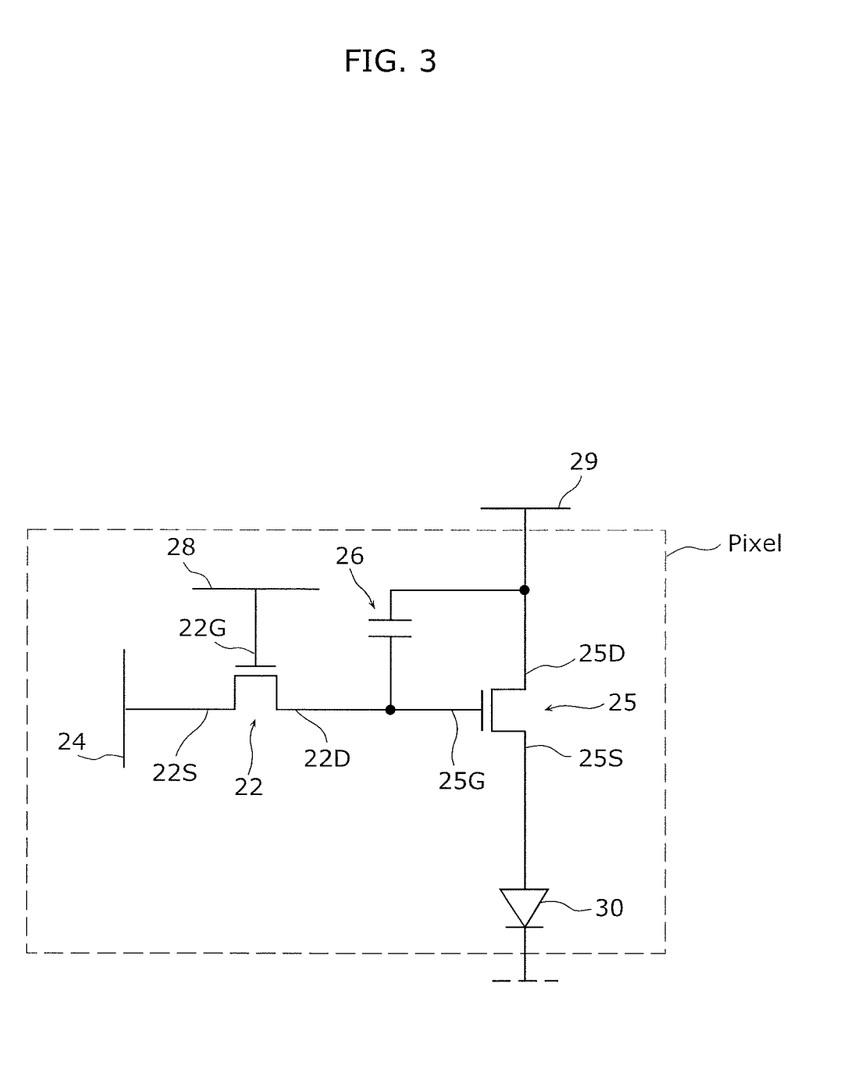
FIG. 3 illustrates a circuit diagram representing a circuit configuration of a pixel included in the organic EL panel according to the embodiment of the present invention.

FIG. 3 illustrates a circuit diagram representing a circuit configuration of a pixel included in the organic EL panel 110.

The pixel includes a pixels circuit 23 and an organic EL element 30. The pixel circuit 23 includes a driving transistor 25, a switching transistor 22, and a capacitor 26.

The driving transistor 25 is used to drive the organic EL element 30. The switching transistor 22 selects a pixel.

Multiple organic EL elements 30 are arranged on the active-matrix substrate 21 and each corresponding to one of the pixels. Each organic EL element 30 includes an anode 31, a cathode 32, and the organic EL layer 40 separated by a bank and provided between the anode 31 and the cathode 32.

The switching transistor 22 has a source electrode 22S connected to a source line 24, a gate electrode 22G connected to a gate line 28, and a drain electrode 22D connected to the capacitor 26 and to a gate electrode 25G of the driving transistor 25.

Moreover, the driving transistor 25 has a drain electrode 25D connected to a power source line 29, and a source electrode 25S connected to an anode of the organic EL element 30.

Here, when a gate signal is inputted to the gate lines 28 and the switching transistor 22 turns on, a signal voltage supplied via the source lines 24 is written in the capacitor 26. The voltage written in the capacitor 26 is held for one frame period. The voltage held in the capacitor 26 makes an analog change in conductance of the driving transistor 25, and a driving current corresponding to a light-emitting gradation flows from the anode to the cathode of the organic EL element 30. Hence, the organic EL layer 40 in the organic EL element 30 glows and the light is displayed as an image.

Figure 4:
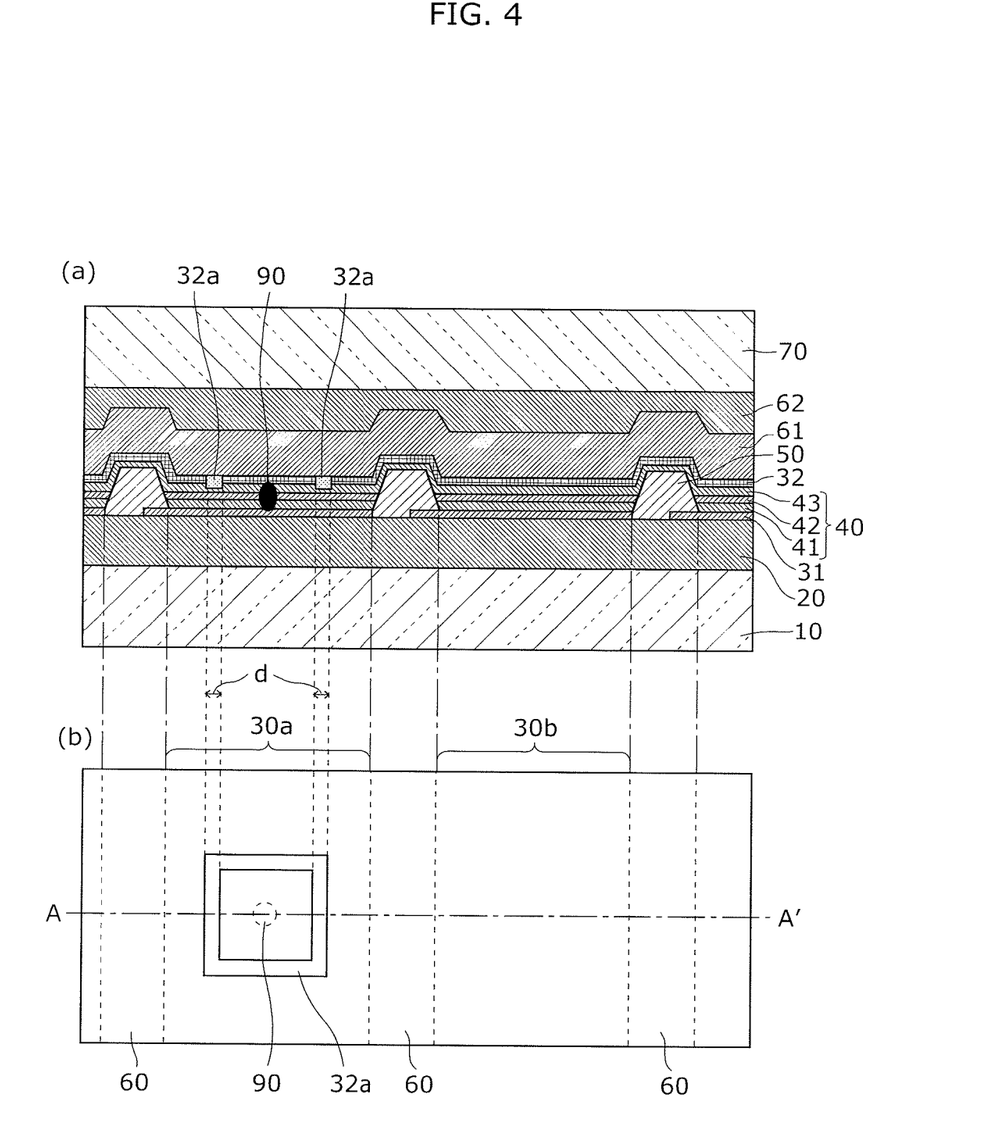

FIG. 4 illustrates configurations of two pixels included in the organic EL panel 110. It is noted that the illustration (a) in FIG. 4 is a cross-sectional view (a cross-sectional view along a line A-A' in the illustration (b) in FIG. 4) of the organic EL panel 110. The illustration (b) in FIG. 4 is a plan view (a top view when the organic EL panel 110 in the illustration (a) in FIG. 4 is seen from the top without a thin-film encapsulating layer 61, an encapsulating resin layer 62, and a transparent substrate 70) of the organic EL panel 110.

Organic EL elements 30a and 30b are the organic EL element 30 in FIG. 3. Each of the organic EL element 30a and 30b corresponds to a different pixel and includes: a substrate 10; a planarizing layer 20 formed above the substrate 10; an anode (a lower electrode) 31, an organic EL layer 40, and a cathode (an upper electrode) 32 sequentially formed above the planarizing layer 20; the thin-film encapsulating layer 61; the encapsulating resin layer 62; and the transparent substrate 70.

The planarizing layer 20 between the organic EL elements 30a and 30b has a bank 50 formed to segment, insulate, and separate the organic EL layer 40. Each of portions of the EL layer 40 (a hole injection layer (HIL) 41 and an emitting layer (EML) 42) and the anode 31 separated by the bank 50 forms a different pixel.

The organic EL layer 40 includes: the HIL 41; the EML 42; and an electron transport layer (ETL) 43. The organic EL layer 40 is formed between the anode 31 and the cathode 32. The organic EL layer 40 has a thickness of 100 nm to 200 nm inclusive, for example.

It is noted that the organic EL layer 40 may include a hole transport layer (HTL) and an electron injection layer (EIL) other than the HIL 41, the EML 42, and the ETL 43. Here, the EIL may include polyphenylene vinylene (PPV), and the HTL may include triphenylamine and polyaniline.

The substrate 10 may be a transparent substrate. For example, the substrate 10 may be a transparent glass substrate having a thickness of 0.5 mm and including transparent alkali-free glass. The substrate 10 may be a flexile substrate including resin. The substrate 10 does not have to be transparent. A top-emission organic EL element illustrated in FIG. 4 may include a non-transparent substrate, such as a silicon substrate, as the substrate 10.

The planarizing layer 20 includes a pixel circuit including a circuit device such as a transistor, and a planarizing film to plararize the pixel circuit. An exemplary planarizing film may be an insulating organic material.

The anode 31 is an electrode where holes are supplied that is, where a current flows from the pixel circuit. The anode 31 is formed above the planarizing layer 20. The organic EL elements 30a and 30b are top emission elements, and the anode 31 is formed to be a reflective electrode. The anode 31 as a reflective electrode may be formed in a single-layered structure of a reflective metal such as Al and silver alloy APC, or a double-layered structure of a transparent metal oxide such as indium tin oxide (ITO) and a reflective metal such as silver alloy APC. The anode 31 may have a thickness of 10 nm to 40 nm inclusive, for example. When the organic EL elements 30a and 30b are bottom-emission ones, the anode 31 may be a transparent electrode including a transparent metal oxide such as ITO.

The HIL 41 is formed above the anode 31 and capable of injecting holes in a stable manner or while assisting the generation of the holes. The forming of the HIL 41 contributes to decreasing a driving voltage and increasing the lifetime of a element. The HIL 41 can be formed using a predetermined organic material including a hole injecting material as the main component. For example, the HIL 41 may include a compound such as polyethylenedioxythiophene (PEDOT), and aniline.

The EML 42 is formed above the HIL 41. When a predetermined voltage is applied to the anode 31 and the cathode 32 to re-combine injected electrons and holes and generate energy, the generated energy excites the emitting material of the EML 42 so that the EML 42 emits light. The EML 42 is an organic emitting layer including an organic material having a predetermined electroluminescence capability for each of elements. The EML 42 is formed in a stacking structure whose lower layer is α-NPD(Bis[N-(1-naphthyl)-N-phenyl]benzidine) and upper layer is Alq3(tris-(8-hydroxyquinoline)aluminum).

The ETL 43 is formed between the EML 42 and the cathode 32. The ETL 43 is capable of efficiently transporting electrons injected from the cathode 32 into the EML 42, preventing deactivation of an exciter on an interface between the EML 42 and the cathode 32, and further blocking the holes. The ETL 43 is formed adjacent to the EML 42 and the cathode 32, and provided in common with each of the elements (pixels).

The cathode 32 is an electrode where electrons are supplied—that is where a current flows to the pixel circuit. The cathode 32 is capable of applying a negative voltage, with respect to the anode 31, to the EML 42, and injecting the electrons in the EML 42. The cathode 32 is a transparent electrode formed above the ETL 43 to oppose the anode 31. It is noted that the cathode 32 is a common electrode formed in common with each of the elements.

The materials and configurations of the cathode 32 shall not be limited in particular; however, it is beneficial that the cathode 32 is made of a material and designed in a configuration with a high transmittance. Such a structure makes it possible to implement a display apparatus using a top-emission organic EL element having high luminance efficiency. The cathode 32 may be made of a transplant metal oxide such as indium tin oxide (ITO) or indium zinc oxide (IZO). Moreover, the cathode 32 may be a transparent electrode made of Mg and Ag. The cathode 32 may have a thickness of 10 nm to 40 nm inclusive, for example.

The bank 50 is formed of, for example, black photosensitive resin such as resist.

The thin-film encapsulating layer 61 is a protective layer formed above the cathode 32. The thin-film encapsulating layer 61 protects an organic layer, such as the EML 42, and the cathode 32 from moisture and oxygen, and prevents deterioration of the EML 42. The thin-film encapsulating layer 61 is required to be transparent, and may be made of a transparent insulating material such as silicon nitride (SiN), silicon oxynitride (SiON) and an organic film.

The encapsulating resin layer 62 is an adhesion layer to bond the transparent substrate 70 with a monolithic layer (an organic layer) formed above the substrate 10 and including the planarizing layer 20 through thin-film encapsulating layer 61. The encapsulating resin layer 62 also works as a protective layer to protect an organic layer. The encapsulating resin layer 62 may be made of acrylic or epoxy resin, for example.

Here, the organic EL element 30a is a repaired abnormal element. In other words, the organic EL element 30a contains, during the manufacturing process, a conductive foreign substance 90 between the anode 31 and the cathode 32. The organic EL element 30 includes: a short-circuit portion at which the anode 31 and the cathode 32 short-circuit via the foreign substance 90; and an altered portion 32a which is (i) formed to be highly resistive by irradiating the cathode 32 with a laser beam and becomes highly resistive, and (ii) positioned on a current pathway between the cathode 32 and the short-circuit portion. In contrast, the organic EL element 30b is a normal element which does not include a short-circuit portion. It is noted that the altered portion 32a is an exemplary resistance portion. The altered portion 32a is a portion of the cathode 32 which is left un-irradiated with a laser beam—that is, a highly resistive portion of the cathode 32 that is a normal element.

It is noted the abnormal element obtains a defective portion which is the short-circuit portion between the anode 31 and the cathode 32 due to the conductive foreign substance 90 that enters during the manufacturing process. Hence, the organic EL panel 110 including the abnormal element shows a dead spot or a dark spot as a defect caused by the short-circuit portion. The foreign substance 90 is formed of Al, a material of the anode 31, which attaches to the anode 31 after the anode 31 is formed. When the organic EL layer 40 and the cathode 32 are stacked with the conductive foreign substance 90 attached, the short-circuit portion appears between the anode 31 and the cathode 32. The short-circuit portion inevitably causes a current, which is primarily for light emitting, to intensively flow into the short circuit portion. Hence, a element which contains the foreign substance 90 cannot sufficiently emit light or cannot emit light at all. A pixel corresponding to such a element without a normal light-emitting capability is also referred to as dark-spot pixel.

The altered portion 32a is formed by irradiating, with a laser beam, a portion of the cathode 32 around the foreign substance 90. The altered portion 32a is a portion of a material of the cathode 32, the material being irradiated with a laser beam and denatured into a highly resistive substance. Hence, the altered portion 32a can be observed as a laser-irradiated mark. When the cathode 32 includes ITO, the altered portion 32a is where the substance structure of the ITO is altered into a granular substance structure. The altered portion 32a is more resistive than any other portion of the ITO has.

The laser beam is emitted to the cathode 32 to encompass the short-circuit portion caused by the foreign substance 90. For example, the laser beam is emitted to the cathode 32 so as to trace a 20 µm-by-20 µm-square outline defined approximately 20 µm away around the foreign substance 90. As a result, the altered portion 32a is formed out of the cathode 32 in a hollow-square shape (painting-frame shape) as represented in the illustration (b) in FIG. 4, so as to encompass the foreign substance 90. The resistance of the altered portion 32a is higher than the original resistance of the cathode 32 that is left un-irradiated with the laser beam. The altered portion 32a has a sheet resistance of 1 MΩ/sq or higher. It is noted that, in the description below, having being highly resistive means that the resistance of a portion is higher after the portion is irradiated with the laser beam than the resistance of the portion before the portion is irradiated with the laser beam.

Figure 5:
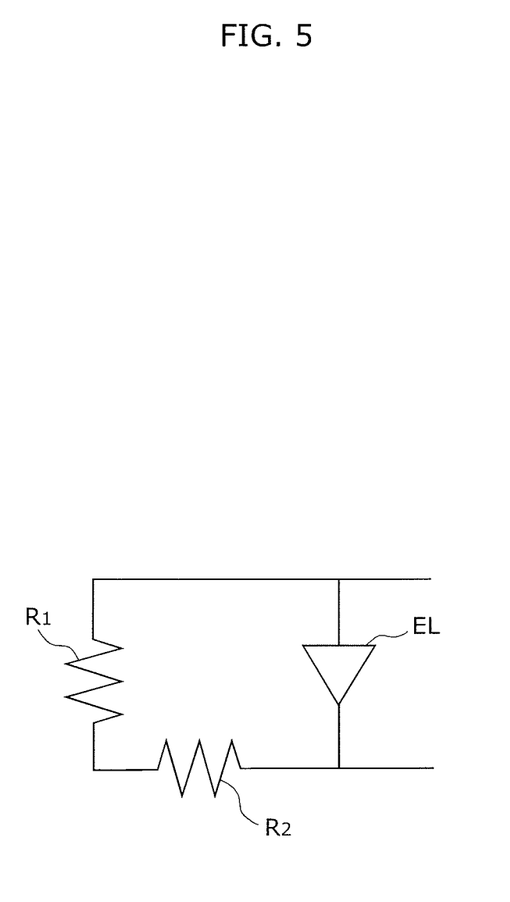
FIG. 5 illustrates an equivalent circuit diagram representing electrical connection relationship between an organic EL layer in a repaired abnormal element, a foreign substance, and an altered portion.

FIG. 5 illustrates an equivalent circuit diagram representing electrical connection relationship between the organic EL layer 40, the foreign substance 90, and the altered portion 32a that are included in the organic EL element 30a in which the altered portion 32a—that is a repaired abnormal element—is formed.

As illustrated in FIG. 5, the repaired organic EL element 30a is of an equivalent circuit on which (i) a resistor R1 formed of the foreign substance 90 and a resistor R2 formed of the altered portion 32a are connected in series with each other, and (ii) a resistor EL formed of the organic EL layer 40 is connected in parallel with the resistors R1 and R2 connected in series. In such a circuit, a high resistance of the resistor R2 formed of the altered portion 32a increases the combined resistance of the resistors R1 and R2 thereby decreasing a current which flows in the resistors R1 and R2. Consequently, the highly-resistive altered portion 32a formed in the organic EL element 30a successfully controls the flow of the current into the foreign substance 90.

Figure 6A:
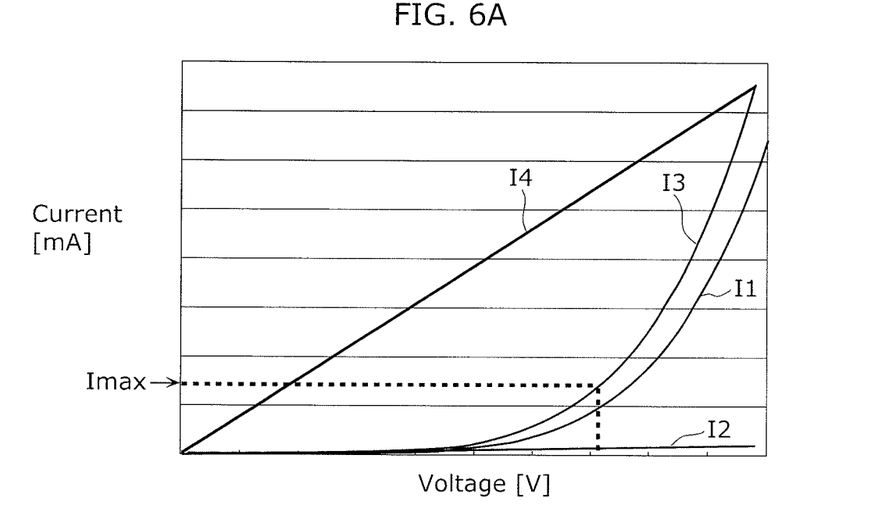
FIG. 6A illustrates current-voltage characteristics of the repaired abnormal element and a normal element.
Figure 6B:
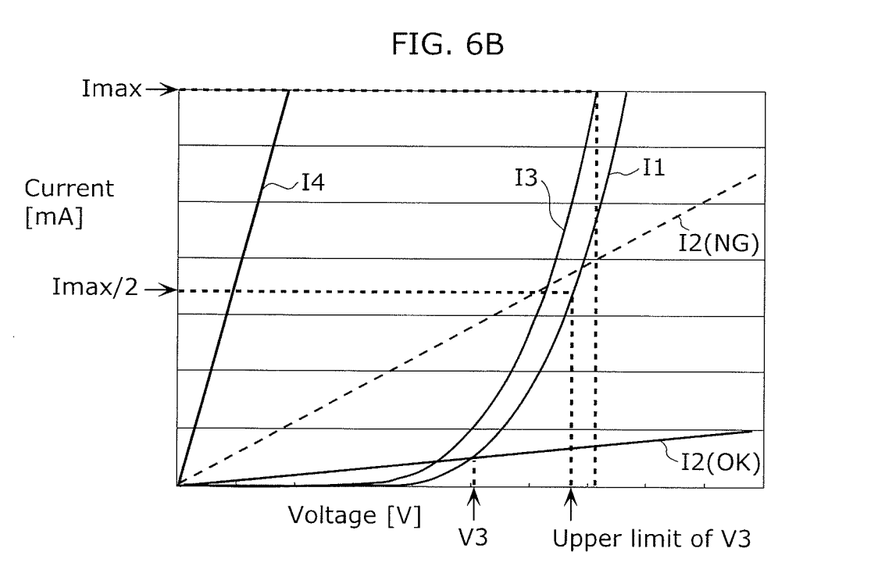
FIG. 6B illustrates current-voltage characteristics of the repaired abnormal element and the normal element.
Figure 6C:
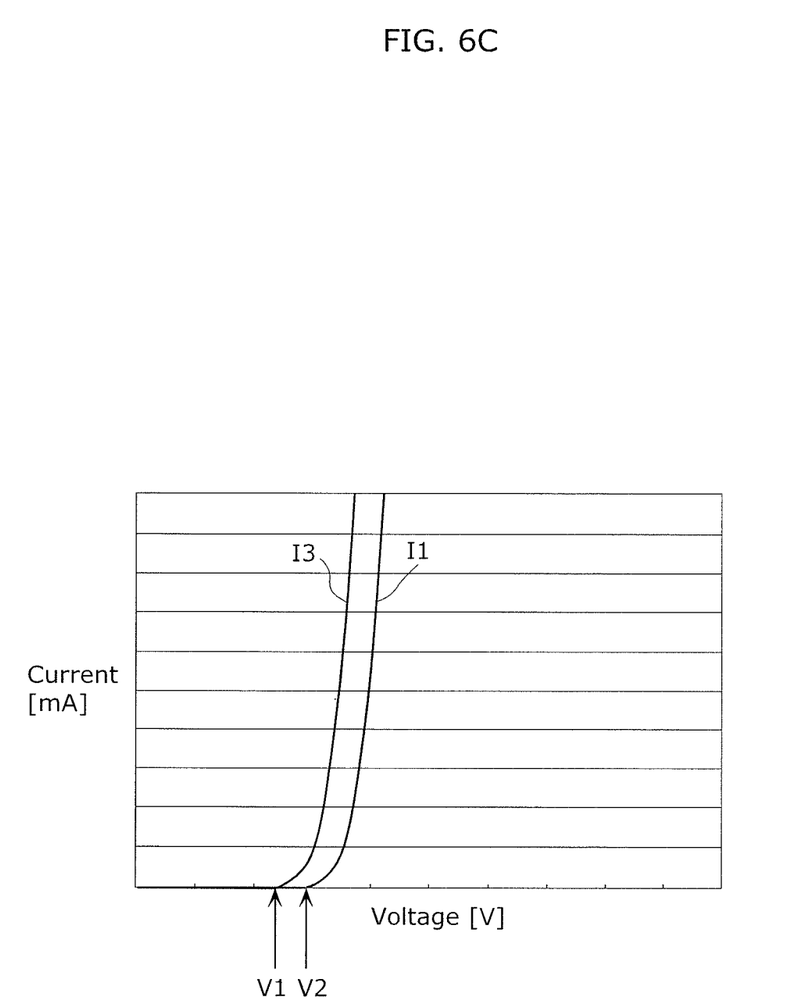
FIG. 6C illustrates current-voltage characteristics of the repaired abnormal element and the normal element.

FIGS. 6A to 6C illustrate current-voltage characteristics of the organic EL element 30a—that is a repaired abnormal element—and the organic EL element 30b—that is a normal element. In each of FIGS. 6A to 6C, the abscissa represents a voltage applied between the anode 31 and the cathode 32, and the ordinate represents a current flowing in the organic EL layer 40 or in the foreign substance 90 and the altered portion 32a. FIG. 6B illustrates FIG. 6A whose range of the ordinate is reduced, and FIG. 6C illustrates FIG. 6A whose range of the ordinate is enlarged. $I_1$ represents a current flowing in the organic EL layer 40 (the resistor EL in FIG. 5) included in the repaired abnormal element. $I_2$ represents a current flowing in the foreign substance 90 and the altered portion 32a (the resistors R1 and R2 in FIG. 5) included in the repaired abnormal element, $I_3$ represents a current flowing in the organic EL layer 40 included in the normal element. $I_4$ represents a current flowing in the foreign substance 90 included in a non-repaired abnormal element in which no altered portion 32a is formed. Furthermore, the currents $I_1$ and $I_3$ have a linear relationship with the light-emission luminance of the organic EL layer 40.

FIGS. 6A to 6C illustrate that the currents $I_1$ and $I_3$ flowing in the organic EL layer 40 show EL diode characteristics and are non linear. In contrast, the currents $I_2$ and $I_4$ flowing in the resistors R1 and R2 show ohmic properties and are linear because the altered portion 32a has ohmic properties. The repair of the abnormal element changes the current which flows in the foreign substance 90 and the altered portion 32a from $I_4$ to $I_2$, and the change results in a decrease in current flow. The current $I_1$ is smaller than the current $I_3$ in the change rate of the current to the voltage, for the amount of the current flowing to the foreign substance 90 and the altered portion 32a.

The current $I_3$ in FIGS. 6A to 6C shows that, in the normal element, the organic EL layer 40 (i) conducts a current and emits light when a voltage higher than or equal to $V_1$ (a first voltage) is applied between the anode 31 and the cathode 32, and (ii) does not conduct a current and does not emit light when a voltage lower than $V_1$ is applied. In contrast, the current $I_1$ in FIGS. 6A to 6C shows that, in the repaired abnormal element, the organic EL layer 40 (i) conducts a current and emits light when a voltage higher than or equal to $V_2$ (a second voltage) is applied between the anode 31 and the cathode 32, and (ii) does not conduct a current and does not emit light when a voltage lower than $V_2$ is applied. Here, $V_2$ is higher than $V_1$.

As illustrated in FIGS. 6A to 6C, the current $I_1$ and $I_2$ cross with $V_3$ (a third voltage). Thus, the altered portion 32a has a resistance lower than a resistance of the organic EL layer 40 (the resistance, between the anode 31 and the cathode 32, observed in a region which is not encompassed with the altered portion 32a) when a voltage lower than $V_3$ is applied between the anode 31 and the cathode 32. The altered portion 32a has a resistance higher than the resistance of the organic EL layer 40 when a voltage higher than or equal to $V_3$ is applied between the anode 31 and the cathode 32. Hence, once the voltage reaches $V_3$, the current $I_1$ flowing in the organic EL layer 40 is greater than the current $I_2$ flowing in the foreign substance 90 and the altered portion 32a. Consequently, the organic EL layer 40 is free from the foreign substance 90 and emits light.

When a voltage applied between the anode 31 and the cathode 32 is between 0V and $V_1$, the organic EL layer 40 does not conduct a current in neither the abnormal element nor the normal element. Thus, the organic EL layer 40 does not emit light. When the voltage between the anode 31 and the cathode 32 goes higher than $V_1$, however, the organic EL layer 40 only in the normal element conducts a current and starts emitting light. When the voltage between the anode 31 and the cathode 32 goes even higher than $V_2$, the organic EL layer 40 in the repaired abnormal element conducts a current and starts emitting light. Here, $V_2$ is a very low voltage. Even though a voltage between $V_1$ and $V_2$ is applied between the anode 31 and the cathode 32, the normal element emits invisible light having low gradation and low luminance, and it is impossible to recognize that the abnormal element does not emit light. When the voltage between the anode 31 and the cathode 32 goes higher and exceeds $V_3$, the normal element emits visible light having high gradation and high luminance. In the repaired abnormal element, the organic EL layer 40 starts to conduct a greater current than the altered portion 32a and the foreign substance 90 does and the abnormal element starts to emit light as bright as the light from the normal element. Consequently, it is impossible to recognize that the element is an abnormal one. Such features make the abnormal element indistinguishable from the normal element by the difference in light emitting in any given voltage region.

Hence, the values of $V_2$ and $V_3$ are set so that the repaired abnormal element does not emit light when the normal element emits invisible light. Such setting allows the repaired abnormal element to operate appropriately as well as slows a repair-caused reduction in the light emission lifetime of the organic EL layer 40 which occurs when the altered portion 32a and the foreign substance 90 conduct a great current in low gradation in which the repaired abnormal element does not have to emit light. Where Imax is the maximum value of a current flowing in the organic EL layer 40 included in the normal element, for example, $V_3$ is lower than or equal to a voltage corresponding to a current value of 50% as high as Imax. For example, $V_3$ may correspond to a current value of 50% as high as Imax. It is noted that the light-emission luminance of an organic EL element is highest in light-emission luminance at Imax—that is the highest value of the current.

Adjustment of $V_2$ and $V_3$ is made by changing the resistance of the altered portion 32a. The change in the resistance is made by changing (i) the width (a width d in FIG. 4) of the altered portion 32a and (ii) the degree of denaturation in forming the altered portion 32a by changing the intensity of and the time period for the laser beam.

In the above-described organic EL panel 110 according to the embodiment, a portion of the cathode 32 is altered to form the altered portion 32a so that the altered portion 32a encompasses the foreign substance 90 that is a cause of the short-circuit defect. Hence, the altered portion 32a can form a highly resistive region between the cathode 32 and the foreign substance 90. Thus, when a voltage is supplied between the anode 31 and the cathode 32, the current is more likely to flow to a region included in the organic EL layer 40 other than a region encompassed with the altered portion 32a and included in the organic EL layer 40. Such features can eliminate a short-circuit defect due to the foreign substance 90 between the anode 31 and the cathode 32, and restore the light emission capability of the organic EL layer 40. Here, the altered portion 32a is not completely insulated and allows a degree of current to flow in the foreign substance 90, which contributes to slowing the reduction in the light emission lifetime of the organic EL layer 40.

Described next is a method for manufacturing the organic EL panel 110 according to the embodiment. The manufacturing method includes a step to repair a defect due to a short circuit of the organic EL element 30a.

Figure 7:
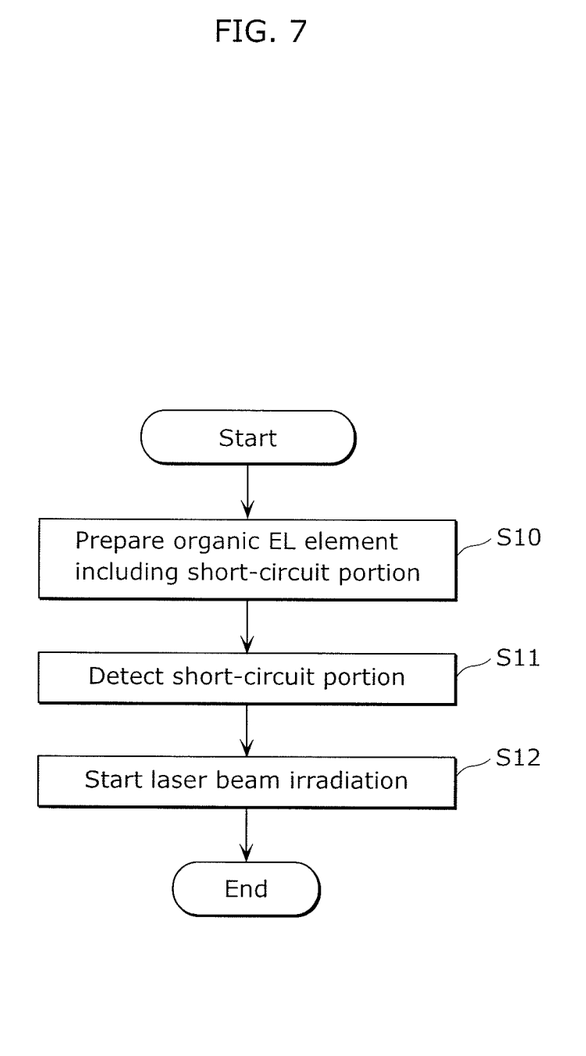
FIG. 7 illustrates a flowchart representing a method for manufacturing the organic EL panel according to the embodiment of the present invention.

Described next is the method for manufacturing the organic EL panel 110 according to the embodiment, with reference to FIG. 7. FIG. 7 illustrates a flowchart representing a method for manufacturing the organic EL panel 110 according to the embodiment.

First, the organic EL panel 110 is prepared (Step S10). The organic EL panel 110 has multiple organic EL organic EL elements including the organic EL element 30a having a short-circuit portion at which the anode 31 and the cathode 32 short-circuit; and the organic EL element 30b not having a short-circuit portion. As described above, the organic EL panel 110 has the organic EL elements arranged in a matrix for each pixel.

Next, the organic EL elements in the prepared organic EL panel 110 are inspected for each pixel to detect an abnormal element, and, in the detected abnormal element, the short-circuit portion is detected as a defective portion (Step S11). Here, the short-circuit portion is where the anode 31 and the cathode 32 short-circuit.

Then laser beam irradiation starts, and a defect due to the detected short-circuit portion is irradiated with the laser beam and repaired (Step S12). The irradiation repairs the organic EL element 30a—that is the abnormal element—included in the organic EL elements.

Figure 8:
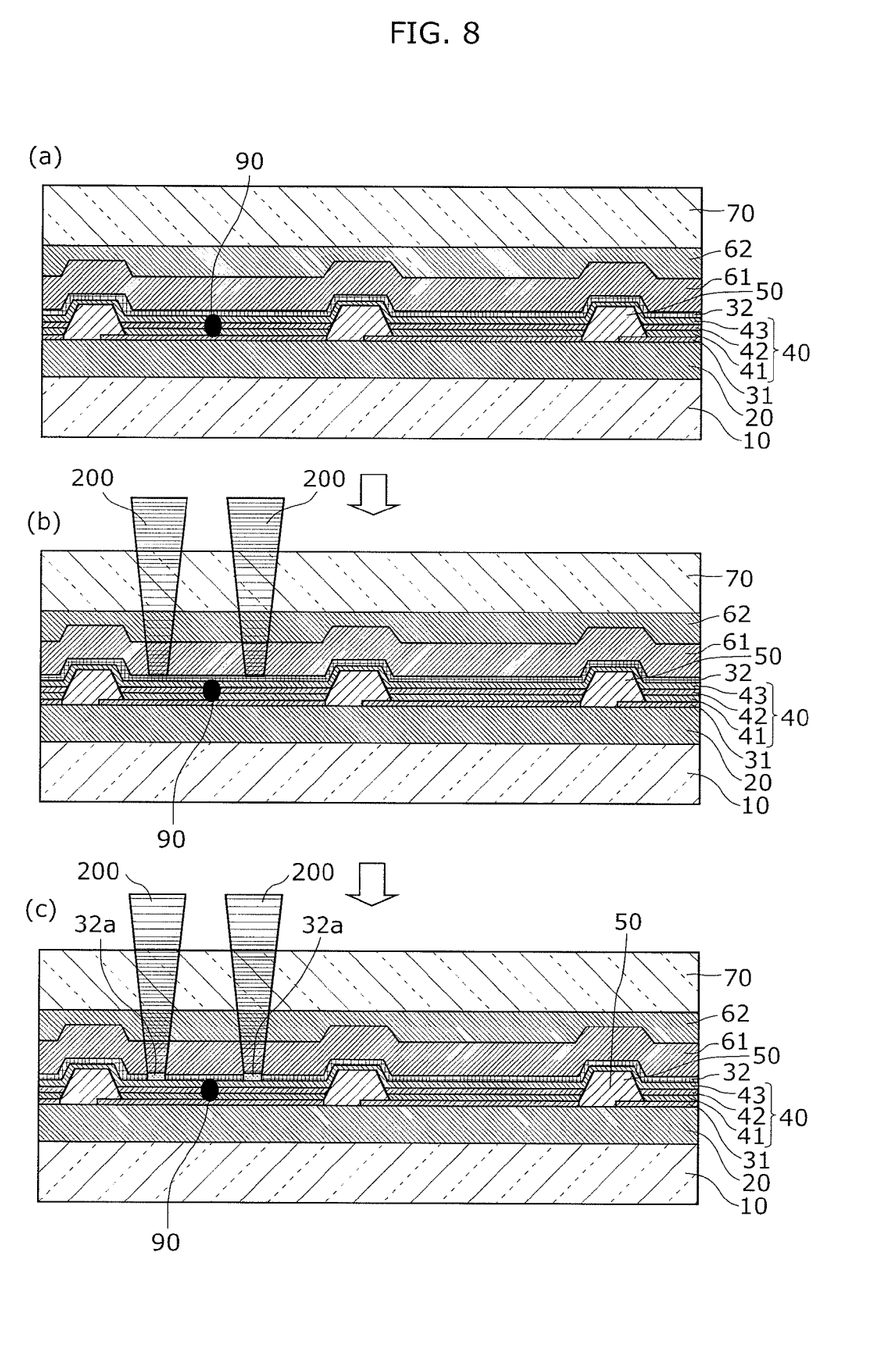

Detailed hereinafter is each of the steps with reference to FIG. 8. FIG. 8 illustrates a cross-sectional view representing the organic EL panel 110 in each of the steps in the manufacturing method for the organic EL panel 110 according to the embodiment. It is noted that the illustration (a) in FIG. 8 is a cross-sectional view of the organic EL panel 110 prepared in Step S10 of FIG. 7. The illustration (b) in FIG. 8 is a cross-sectional view representing how the organic EL panel 110 is irradiated with the laser beam in Step S12 of FIG. 7. The illustration (c) in FIG. 8 is a cross-sectional view representing the altered portion 32a formed in the organic EL panel 110 in Step S12 of FIG. 7.

Described first is a step (Step S10 in FIG. 7) to prepare the organic EL panel 110 including the organic EL element 30a having the short-circuit portion.

First, a planarizing film, including an insulating organic material, is formed above the substrate 10 to form the planarizing layer 20. Then, the anode 31 is formed above the planarizing layer 20. For example, forming the anode 31 involves depositing, above the planarizing layer 20, Al of 30 nm in film thickness using sputtering, and then patterning the Al film by photolithography and wet etching.

Next, for example, PEDOT is dissolved in a solvent including xylene, and the PEDOT solution is spin coated above the anode 31 to form the HIL 41.

Then, α-NPD and Alq3 are stacked above the HIL 41 by, for example, vacuum deposition to form the EML 42.

Next, for example, a compound such as nitro-substituted fluorenone derivative is stacked above the EML 42 to form the ETL 43. The ETL 43 is stacked by deposition, spin coating, and casting.

Then, the cathode 32 is formed without exposing to the air the substrate 10 above which the ETL 43 is formed. Specifically, ITO of 35 nm in film thickness is deposited above the ETL 43 by sputtering to form the cathode 32.

The organic elements 30a and 30b working as light-emitting elements are formed in the above manufacturing steps. It is noted that, in manufacturing the organic EL panel 110, a step for patterning the bank 50, made of photosensitive resin and to be formed in a predetermined shape, is included between the step for forming the anode 31 and the step for forming the HIL 41. The patterning step is included in order to form multiple EMLs 42 segmented in a matrix.

Next, SiN of 500 nm in film thickness is deposited above the cathode 32 by, for example, plasma chemical vapor deposition (CVD) to form the thin-film encapsulating layer 61. Since the thin-film encapsulating layer 61 is formed in contact with a surface of the cathode 32, it is beneficial for the thin-film encapsulating layer 61 to set a severe requirement as, in particular, a protective film. Favorably, the thin-film encapsulating layer 61 may include a non-oxygen series inorganic material typified by the above-described SiN. The thin-film encapsulating layer 61 may include oxygen series inorganic material such as silicon oxide and silicon oxynitride, and be formed of multiple layers of the inorganic materials. It is noted that the technique for forming the thin-film encapsulating layer 61 shall not be limited to the PECVD; instead, another technique may be utilized such as sputtering using argon plasma.

Then, the encapsulating resin layer 62 is applied to the surface of the thin-film encapsulating layer 61. The transparent substrate 70 made of transparent glass is provided above the applied encapsulating resin layer 62. Here color filters (light control layer) may be previously formed on the main surface of the transparent substrate 70. In such a case, the transparent substrate 70 is provided on the applied encapsulating resin layer 62 so that the surface on which the color filters are formed faces the thin-film encapsulating layer 61. It is noted that the thin-film encapsulating layer 61, the encapsulating resin layer 62, and the transparent substrate 70 work as protective layers.

Lastly, the encapsulating resin layer 62 is hardened by applying a heat or energy ray to the encapsulating resin layer 62 while putting downward pressure on the transparent substrate 70 from the upper side, so that the transparent substrate 70 and the thin-film encapsulating layer 61 bond together.

Such a technique makes it possible to form the organic EL panel 110 in the illustration (a) in FIG. 8. It is noted that the anode 31, the HIL 41, the EML 42, the ETL 43, and the cathode 32 may be formed in, but not limited to, the steps in the embodiment.

Described next is a step to detect the organic EL element 30a as an abnormal element and a defective portion of the organic EL element 30a. The step involves detecting a portion short-circuited by the foreign substance 90 or the contained foreign substance 90 itself.

An exemplary detection of the portion where the anode 31 and the cathode 32 are short-circuited or of the foreign substance 90 itself is conducted as follows: A luminance signal voltage corresponding to an intermediate luminance gradation is inputted to each of the elements. Then the light-emission luminance of an abnormal element—that is a lower luminance than the light-emission luminance of a normal element—is detected either visually or by a luminance measurement apparatus using a CCD camera. It is noted that the technique to detect the short-circuited portion or the foreign substance 90 shall not be limited to the above one; instead, for example, a current value is measured between the anode 31 and the cathode 32 in each of the elements to detect the short-circuited portion or the foreign substance 90 based on the level of the measured current value. Here, if a element presents a current value equivalent to a current value of the normal element when a forward-bias voltage is applied to the element and develops leak light emission when a reverse-bias voltage is applied to the element, such a element may be determined as an abnormal element.

Described next is a step (step S12 in FIG. 7) to execute laser beam irradiation to repair a defect caused by the defective portion in the organic EL element 30a; namely an abnormal element. As the illustration (b) in FIG. 8 represents, the step involves irradiating, with the laser beam 200 from the transparent-substrate-70 side, the cathode 32 provided above the short-circuit portion in the organic EL element 30a.

Specifically, after the foreign substance 90 is detected, the step involves altering the material of the anode 31 by the laser beam 200 emitted in a line to trace an outline formed in a predetermined shape and to encompass the portion where the anode 31 and the cathode 32 are short-circuited by the foreign substance 90. For example, the laser beam 200 is emitted along the outline of a square for all the sides. It is noted that the focus of the laser beam 200 is set according to the cathode 32.

The laser beam 200 can be oscillated using a laser oscillator. For example, the laser beam 200 may be an ultrashort pulse laser having the output energy of 1 µJ to 30 µJ and the pulse width of several femto seconds (fs) to several picosecond-order (ps). A favorable pulse width ranges between 100 fs and 20 ps. Such features make it possible to reduce the pulse time of the laser beam 200 emitted to the organic EL layer 40, which contributes to reducing damage to the organic EL layer 40 and changing the short-circuit portion to be highly resistive. It is noted that the laser beam 200 may have the wavelength of 900 nm to 2500 nm. The irradiation condition of the laser beam 200 may be set depending on intended values of $V_2$ and $V_3$ so that the formed altered portion 32a is a desired one.

Hence, the irradiation with the ultrashort pulse laser alters the material of the cathode 32 in an amorphous state (non-crystalline state) to a highly resistive one with ease. In particular the ultrashort pulse laser can alter a transparent conductive material which cannot be easily processed with another laser to be highly resistive.

As the illustration (c) in FIG. 8 represent, the substance structure of a portion of the cathode 32 irradiated with the laser beam 200 changes to the altered portion 32a having a granular substance structure. Here, the granular substance structure is a structure in which multiple particles gather with air gaps left therebetween. The particle size of 10 to 500 nm is an exemplary particle size of each of the particles included in the granular substance structure. Moreover, within the altered portion 32a, air gaps are found between the particles. Thanks to the air gaps, the altered portion 32a is less likely to conduct a current compared with a non-altered portion of the cathode 32, thereby considered to be highly resistive.

The above-described method for manufacturing the organic EL panel 110 according to the embodiment can repair a short-circuit defect due to the foreign substance 90 between the anode 31 and the cathode 32, and restore the light emission capability of the organic EL layer 40. Here, the altered portion 32a is not completely insulated and allows a degree of current to flow in the foreign substance 90, which contributes to slowing the reduction in the light emission lifetime of the organic EL layer 40.

Although only an exemplary embodiment of this invention has been described in detail above, those skilled in the art will readily appreciate that many modifications are possible in the exemplary embodiment without materially departing from the novel teachings and advantages of this invention. Accordingly, all such modifications are intended to be included within the scope of this invention.

Figure 9:
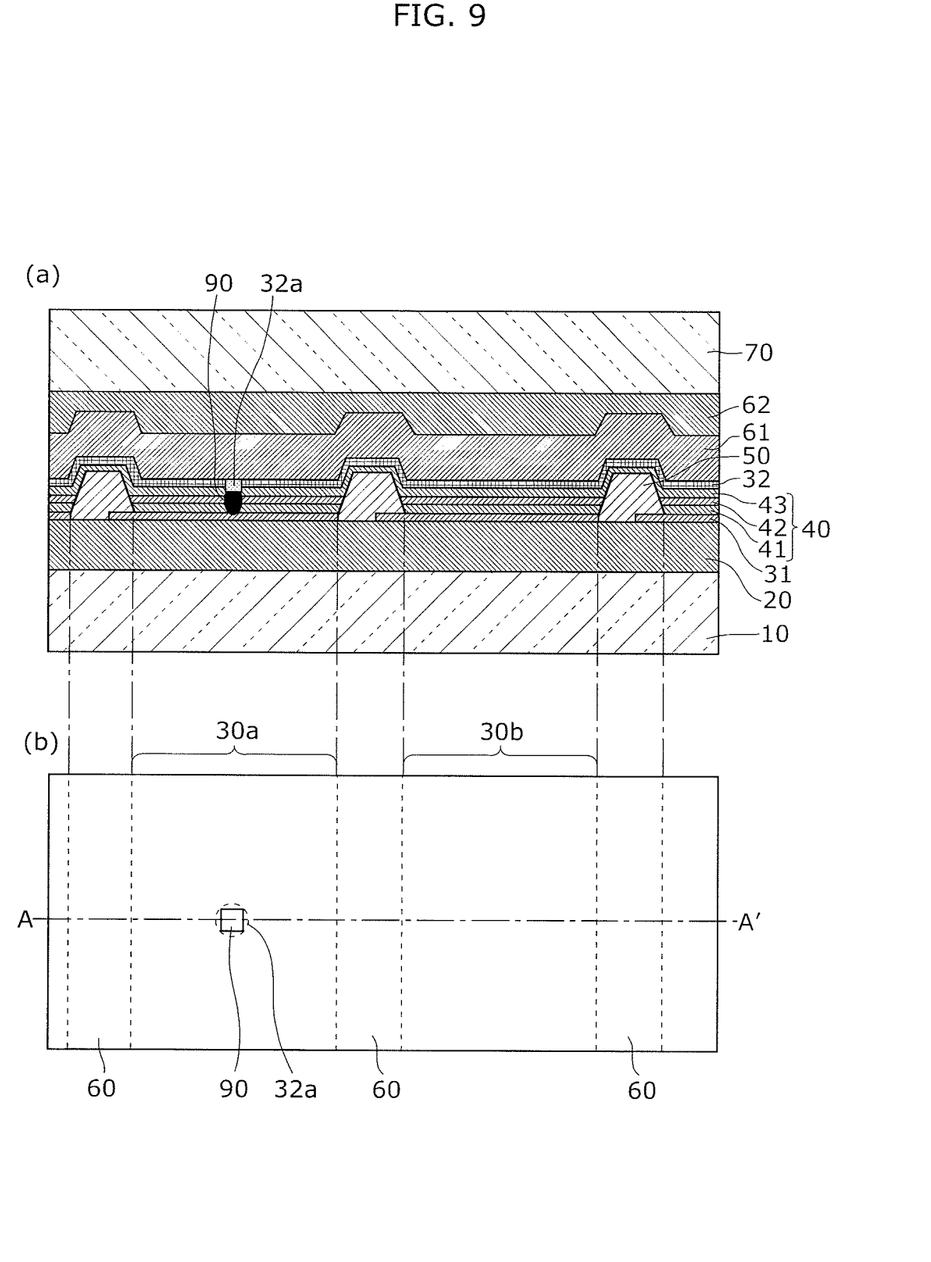

In the embodiment, for example, the altered portion 32a is formed by irradiating the cathode 32 with a laser beam so that a short-circuit portion (the foreign substance 90) is encompassed, and altering a portion (the portion in which the short-circuit portion is encompassed) of the cathode 32 is formed to be highly resistive. As FIG. 9 illustrates, however, the altered portion 32a may be formed by irradiating the cathode 32 with a laser beam so that the laser beam directly contacts the short-circuit portion, and altering a portion (the portion in contact with the short-circuit portion) of the cathode 32 is formed to be highly resistive.

Moreover, in the embodiment, the altered portion 32a is formed to be highly resistive by irradiating the cathode 32 with a laser beam. Instead, the altered portion 32a may be formed to be highly resistive by irradiating the anode 31 with a laser beam, so that the altered portion 32a can be formed on a current pathway between the anode 31 and a short-circuit portion. The altered portion 32a may also be formed to be highly resistive by irradiating the organic EL layer 40 with a laser beam, so that the altered portion 32a can be formed on a current pathway between the short-circuit portion and one of the anode 31 and the cathode 32. In other words, the altered portion 32a may be formed in any one or all of the anode 31, the cathode 32, and the organic EL layer 40 as far as the altered portion 32a is formed to be highly resistive by laser irradiation and located between a short-circuit portion and one of the anode 31 and the cathode 32. Hence, the altered portion 32a is a portion of a material of at least one of the anode 31, the organic EL layer 40, and the cathode 32, the portion being irradiated with a laser beam and altered to a highly resistive substance. In such a case, as well, the electrical connection relationship in FIG. 5 is established between the organic EL layer 40, the foreign substance 90, and the altered portion 32a.

Moreover, in the embodiment, the organic EL elements 30a and 30b may further have color filters above the thin-film encapsulating layer 61 and the encapsulating resin layer 62 so that the color filters covers each of the organic EL elements 30a and 30b separated by the bank 50. The color filters may be used for adjusting colors of red, green, and blue. Here, the laser beam irradiation for the repair is executed through the color filters, as well as the protective layer. It is noted that the color filters may be provided to the undersurface (the surface facing the organic EL layer 40) of the transparent substrate 70.

Furthermore, in the embodiment, the anode 31 is the lower electrode, and the cathode 32 is the upper electrode. Instead, the anode 31 may be the upper electrode, and the cathode 32 may be the lower electrode.

INDUSTRIAL APPLICABILITY

The present invention is applicable to organic EL panels and methods for manufacturing the organic EL panel. In particular, the present invention may be applicable to flat panel displays including organic EL display apparatuses, or to display apparatuses for television sets, personal computers, or cellular phones including such flat panel displays.

REFERENCE SIGNS LIST

10 Substrate
20 Planarizing layer
21 Active-matrix substrate
22 Switching transistor
22D and 25D Drain electrode
22G and 25G Gate electrode
22S and 25S Source electrode
23 Pixel circuit
24 Source line
25 Driving transistor
26 Capacitor
28 Gate line
29 Power source line
30, 30a, and 30b Organic EL element
31 Anode 32 Cathode
32a Altered portion
40 Organic EL layer
41 HIL
42 EML
43 ETL
50 Bank
61 Thin-film encapsulating layer
62 Encapsulating resin layer
70 Transparent substrate
90 Foreign substance
100 Display apparatus
110 Organic EL panel
200 Laser beam

The invention claimed is:

1. An organic electroluminescence (EL) panel comprising organic EL elements arranged in a matrix and each including an anode, a cathode, and an organic EL layer provided between the anode and the cathode, the organic EL elements including a first organic EL element and a second organic EL element,
wherein the first organic EL element includes:
an abnormal portion including:
a short-circuit portion at which a portion of the anode and a portion of the cathode are short-circuited; and
a resistive portion formed by irradiating, with a laser beam, at least one of the cathode and the anode of the first organic EL element to alter an irradiated portion to be higher in resistance than before being irradiated, and the resistive portion positioned on a current pathway between the short-circuit portion and a portion of one of the anode and the cathode that is not short-circuited,
the second organic EL element includes:
a normal portion which does not include the short-circuit portion,
in the normal portion, the organic EL layer is structured to (i) emit light when a voltage higher than or equal to a first voltage is applied between the anode and the cathode, and (ii) not emit light when a voltage lower than the first voltage is applied between the anode and the cathode, and
in the abnormal portion including the resistive portion, the organic EL layer is structured to (i) emit light when a voltage higher than or equal to a second voltage is applied between the anode and the cathode, and (ii) not emit light when a voltage lower than the second voltage is applied between the anode and the cathode, the second voltage being higher than the first voltage,
wherein
the resistive portion is formed by denaturing the irradiated portion into a granular substance structure.

2. The organic EL panel according to claim 1,
wherein the resistive portion has:
a resistance lower than a resistance of the organic EL layer when a voltage lower than a third voltage is applied between the anode and the cathode; and a resistance higher than the resistance of the organic EL layer when a voltage higher than or equal to the third voltage is applied between the anode and the cathode.

3. The organic EL panel according to claim 1,
wherein the resistive portion has an ohmic property.

4. The organic EL panel according to claim 2,
wherein the third voltage is lower than or equal to a voltage corresponding to a current value of 50% of a maximum value of a current which flows in the organic EL layer in the normal portion.

5. The organic EL panel according to claim 1,
wherein the resistive portion is structured to be highly resistive by irradiating, with the laser beam, at least one of the anode and the cathode, the laser beam surrounding or contacting the short-circuit portion.

6. A method for manufacturing an organic EL panel, the method comprising:
forming organic EL elements each including an anode, an organic EL layer, and a cathode; and
repairing an abnormal portion in the organic EL elements, the organic EL elements-including the abnormal portion and a normal portion,
wherein the abnormal portion includes a short-circuit portion at which a portion of the anode and a portion of the cathode are short-circuited,
the normal portion does not include the short-circuit portion,
the repairing the abnormal portion includes forming a resistive portion which is formed by irradiating, with a laser beam, at least one of the cathode and the anode to alter an irradiated portion to be higher in resistance than before being irradiated, the resistive portion being positioned on a current pathway between the short-circuit portion and a portion of one of the anode and the cathode that is not short-circuited,
in the normal portion, the organic EL layer (i) emits light when a voltage higher than or equal to a first voltage is applied between the anode and the cathode, and (ii) does not emit light when a voltage lower than the first voltage is applied between the anode and the cathode, and
in the abnormal portion, the organic EL layer, including the resistive portion, (i) emits light when a voltage higher than or equal to a second voltage is applied between the anode and the cathode, and (ii) does not emit light when a voltage lower than the second voltage is applied between the anode and the cathode, the second voltage being higher than the first voltage,
wherein
the resistive portion is formed by denaturing the irradiated portion into a granular substance structure.

7. The organic EL panel according to claim 1,
wherein, in the first organic EL element comprising the cathode, the anode and the organic EL layer, the cathode is disposed over the organic EL layer and the anode, and the cathode is irradiated with the laser beam.

* * * * *